(12) United States Patent
Feron et al.

(10) Patent No.: US 8,785,297 B2
(45) Date of Patent: Jul. 22, 2014

(54) METHOD FOR ENCAPSULATING ELECTRONIC COMPONENTS ON A WAFER

(71) Applicant: STMicroelectronics (Tours) SAS, Tours (FR)

(72) Inventors: Marc Feron, Tours (FR); Vincent Jarry, La Membrolle sur Choisille (FR); Laurent Barreau, Cinq Mars la Pile (FR)

(73) Assignee: STMicroelectronics (Tours) SAS, Tours (FR)

( * ) Notice: Subject to any disclaimer, the term of this patent is extended or adjusted under 35 U.S.C. 154(b) by 0 days.

(21) Appl. No.: 13/649,797

(22) Filed: Oct. 11, 2012

(65) Prior Publication Data

US 2013/0043586 A1     Feb. 21, 2013

Related U.S. Application Data

(62) Division of application No. 12/946,986, filed on Nov. 16, 2010, now Pat. No. 8,309,403.

(30) Foreign Application Priority Data

Nov. 20, 2009 (FR) ..................... 09 58225

(51) Int. Cl.
    *H01L 21/30* (2006.01)
(52) U.S. Cl.
    USPC .......................... 438/459; 438/977; 438/774
(58) Field of Classification Search
    USPC ......... 438/459, 464, 774, 977, 127, 460, 465, 438/113; 451/5; 257/737, E21.499, E21.5, 257/E21.502, E23.021
    See application file for complete search history.

(56) References Cited

U.S. PATENT DOCUMENTS

| | | | |
|---|---|---|---|
| 6,162,702 A * | 12/2000 | Morcom et al. | 438/459 |
| 7,148,125 B2 * | 12/2006 | Suzuki et al. | 438/459 |
| 7,323,397 B2 * | 1/2008 | Lee et al. | 438/458 |
| 7,687,375 B2 | 3/2010 | Arai et al. | |
| 8,153,452 B2 * | 4/2012 | Amada et al. | 438/17 |
| 8,292,690 B2 * | 10/2012 | Seddon | 451/5 |
| 8,309,403 B2 * | 11/2012 | Feron et al. | 438/127 |

(Continued)

FOREIGN PATENT DOCUMENTS

| | | |
|---|---|---|
| FR | 2901058 A1 | 11/2007 |
| WO | WO 2008/087578 A2 | 7/2008 |

OTHER PUBLICATIONS

Chinese office action dated May 22, 2014 from corresponding Chinese Application No. 201010548135.3.

*Primary Examiner* — Roy Potter
(74) *Attorney, Agent, or Firm* — Wolf, Greenfield & Sacks, P.C.

(57) ABSTRACT

A method for encapsulating electronic components, including the steps of: forming, in a first surface of a semiconductor wafer, electronic components; forming, on the first surface, an interconnection stack including conductive tracks and vias separated by an insulating material; forming first and second bonding pads on the interconnection stack; thinning down the wafer, except at least on its contour; filling the thinned-down region with a first resin layer; arranging at least one first chip on the first bonding pads and forming solder bumps on the second bonding pads; depositing a second resin layer covering the first chips and partially covering the solder bumps; bonding an adhesive strip on the first resin layer; and scribing the structure into individual chips.

22 Claims, 2 Drawing Sheets

(56) References Cited

U.S. PATENT DOCUMENTS

| | | |
|---|---|---|
| 8,507,362 B2 * | 8/2013 | Feng et al. .................. 438/459 |
| 2002/0135020 A1 | 9/2002 | Skotnicki et al. |
| 2004/0145051 A1 | 7/2004 | Klein et al. |
| 2005/0046002 A1 | 3/2005 | Lee et al. |
| 2005/0167798 A1 | 8/2005 | Doan |
| 2006/0046438 A1 | 3/2006 | Kirby |
| 2006/0063312 A1 | 3/2006 | Kurita |
| 2006/0244149 A1 | 11/2006 | Nakumura et al. |
| 2006/0292826 A1 | 12/2006 | Kajiyama et al. |
| 2007/0296089 A1 | 12/2007 | Thomas et al. |

* cited by examiner

METHOD FOR ENCAPSULATING ELECTRONIC COMPONENTS ON A WAFER

CROSS REFERENCE TO RELATED APPLICATIONS

This application is a division of prior U.S. application Ser. No. 12/946,986, filed on Nov. 16, 2010 which application claims the priority benefit of French patent application number 09/58225, filed on Nov. 20, 2009, which applications are hereby incorporated by reference to the maximum extent allowable by law.

BACKGROUND OF THE INVENTION

1. Field of the Invention

The present invention relates to a method for encapsulating, before scribing, electronic components formed on a semiconductor wafer. It more specifically relates to a method for encapsulating electronic components on which electronic chips are arranged.

2. Discussion of the Related Art

To manufacture an encapsulated electronic chip, a large number of identical electronic components is formed inside and on top of a semiconductor wafer. One or several interconnection levels are then formed above the electronic components to connect the elements of these components together and to connection pads. It may also be provided to arrange electronic chips at the surface of the interconnection stack, on adapted bonding pads. Once these steps have been carried out, the device is encapsulated, then scribed into individual chips.

To encapsulate electronic components directly on the wafer in which they are formed, known methods provide intermediary steps of gluing of semiconductor wafers, also called handle wafers, at least on one side of the structure. The handle wafers are used to stiffen the structure in different encapsulation steps and during steps of thinning down of the semiconductor wafer in which the components are formed.

A disadvantage of known methods is that the use of such handle wafers is relatively expensive and constraining. Indeed, such handle wafers are thick semiconductor or glass wafers which are damaged by the gluing and separation operations.

A method for encapsulating electronic components on which chips may be arranged and secured is then needed, which does not require the use of semiconductor handle wafers while avoiding warpage phenomena.

SUMMARY OF THE INVENTION

An object of an embodiment of the present invention is to provide a method for encapsulating electronic components formed inside and on top of a semiconductor wafer, directly on this wafer.

Another object of an embodiment of the present invention is to provide a method adapted to the encapsulation of electronic components on which chips are arranged and bonded.

An object of an embodiment of the present invention is to provide a method avoiding problems of warpage of the structure before scribing.

Thus, an embodiment of the present invention provides a method for encapsulating electronic components, comprising the steps of:

(a) forming, inside and on top of a first surface of a semiconductor wafer, electronic components;

(b) forming, on the first surface, an interconnection stack comprising conductive tracks and vias separated by an insulating material;

(c) forming first and second bonding pads on the interconnection stack;

(d) thinning down the semiconductor wafer, except at least on its contour;

(e) filling the thinned-down region with a first resin layer;

(f) installing at least one first chip on the first bonding pads and forming solder bumps on the second bonding pads;

(g) depositing a second resin layer covering the first chips and partially covering the solder bumps;

(h) bonding an adhesive strip on the first resin layer; and (i) scribing the structure into individual chips.

According to an embodiment of the present invention, step (a) further comprises the forming of trenches filled with conductive material on the side of the first surface of the semiconductor wafer;

step (d) is provided to expose the lower surface of said wafers; and step (d) is followed by a step of forming of third bonding pads on the semiconductor wafer, at the level of the trenches filled with semiconductor material and by a step of installing of second chips on the third bonding pads.

According to an embodiment of the present invention, the first resin layer contains loads having a diameter smaller than 20 µm.

According to an embodiment of the present invention, the first and second chips are attached on the corresponding bonding regions by second solder bumps.

According to an embodiment of the present invention, the second solder bumps have a diameter ranging between 20 and 100 µm.

According to an embodiment of the present invention, the first, second, and third bonding pads are formed of a conductive stack.

According to an embodiment of the present invention, step (i) is followed by a separation of the adhesive strip.

The foregoing objects, features, and advantages of the present invention will be discussed in detail in the following non-limiting description of specific embodiments in connection with the accompanying drawings.

DETAILED DESCRIPTION

Figure 1:
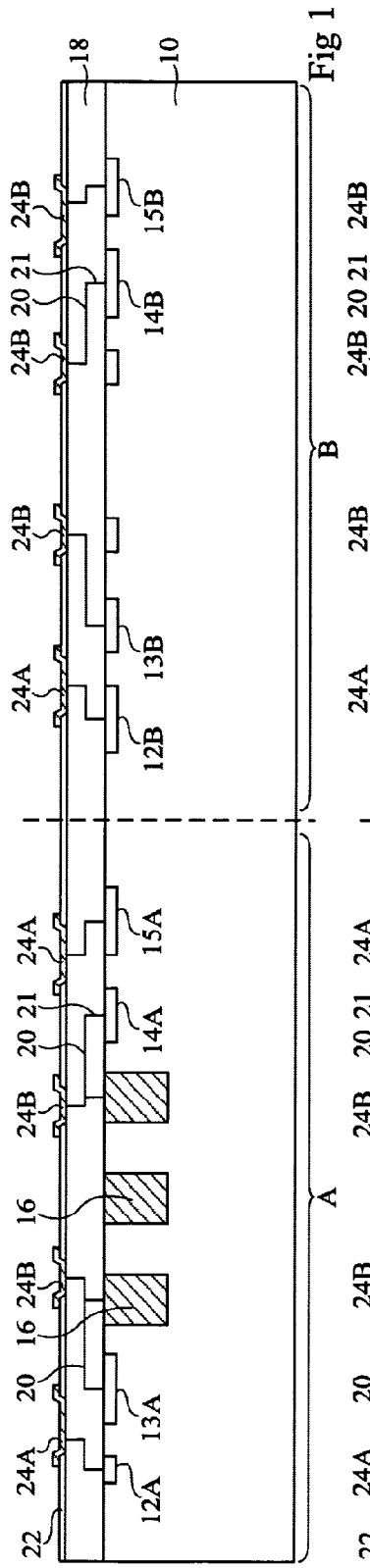
FIGS. 1 to 6 are cross-section views illustrating results of steps of a method according to an embodiment of the present invention.

For clarity, the same elements have been designated with the same reference numerals in the different drawings and, further, as usual in the representation of electronic components on a wafer, the various drawings are not to scale.

To avoid the use of handle wafers in steps of encapsulation of electronic components on a wafer and warpage phenomena, the present inventors provide, in one embodiment, a method using rigid resin layers and beams for stiffening the structure.

FIGS. 1 to 6 are cross-section views illustrating results of steps of an encapsulation method according to an embodiment providing encapsulated chips intended to be attached by their front surfaces, that is, on the side of the semiconductor wafer surface on which the electronic components are formed. The method described herein is particularly well adapted to the forming of a stack of surface mount type (SMT) electronic chips.

In the drawings, two alternative embodiments A and B of the method are shown: in alternative A, chips are installed on both surfaces of electronic components formed in a semiconductor wafer while, in alternative B, chips are only installed on the upper surface of this semiconductor wafer.

At the step illustrated in FIG. 1, common to both alternatives A and B, it is started from a structure comprising a thick semiconductor wafer 10, also called a substrate, for example, made of silicon, inside and on top of which electronic components are formed. Wafer 10 may have a thickness ranging between 500 and 900 μm. It should be noted that the selection of the components shown inside and on top of semiconductor wafer 10 is totally arbitrary, and that any electronic component may be formed at the surface of wafer 10. Further, unlike what is shown in the drawings, many electronic components are formed next to one another in semiconductor wafer 10. In particular, power or protection components may be provided. The shown wafer portion is slightly greater than the extent of an electronic component.

In alternative A, at the level of each electronic component, trenches 16 filled with a conductive material are formed in semiconductor wafer 10. Trenches 16 are intended to form through silicon vias (TSV), once a step of thinning down of semiconductor wafer 10 has been carried out. For this purpose, trenches 16 are relatively deep, for example, from 100 to 200 μm. TSV structures being known per se, their forming will not be described any further. A thin insulating layer is formed on the walls of trenches 16.

An interconnection stack 18 is formed at the surface of semiconductor wafer 10. This stack comprises one or several interconnection levels, not detailed, in which are formed conductive tracks 20 connected to one another and to the electronic components by conductive vias 21. The conductive tracks and vias are schematically shown by horizontal lines 20 and vertical lines 21 and are surrounded with an insulating material. Conductive tracks and vias are also provided all the way to contact conductive trenches 16 in the case of alternative A.

At the surface of interconnection stack 18 is formed an insulating layer 22 comprising openings of connection with chips installed thereon and with solder bumps. Conductive bonding regions or pads 24A and 24B, intended to improve the connection with elements of connection of the installed chips (24B) or solder bumps (24A) are formed at the level of the openings in layer 22. Pads 24A and 24B are, for example, formed of a stack of under bump metallizations (UBM), such a stack comprising at least one lower layer providing a good adherence on tracks 20 of interconnection stack 18 and an upper layer providing a good adherence with elements of connection of the installed chips or with solder bumps. Pads 24A and 24B may for example be obtained by forming of a bonding stack over the entire structure and definition of regions 24A and 24B by etching through a mask. In interconnection stack 18, conductive tracks and vias are provided to reach and connect pads 24A and 24B. In the context of alternative A, a connection 20-21 between a diffused region 12A and a pad 24A, a connection 20-21 between a diffused region 13A, a TSV 16, and a pad 24B, a connection 20-21 between a diffused region 14A, a TSV 16, and a pad 24B, and a connection 20-21 between a diffused region 15A and a pad 24A have been shown as an example. In the context of alternative B, a connection 20-21 between a diffused region 12B and a pad 24A, a connection 20-21 between a diffused region 13B and a pad 24B, a connection 20-21 between a diffused region 14B and a pad 24B, and a connection 20-21 between a diffused region 15B and a pad 24A have been shown as an example.

It should be noted that layer 22 and bonding regions 24A and 24B may be formed later on in the method described herein, before the step of FIG. 5.

Figure 2:
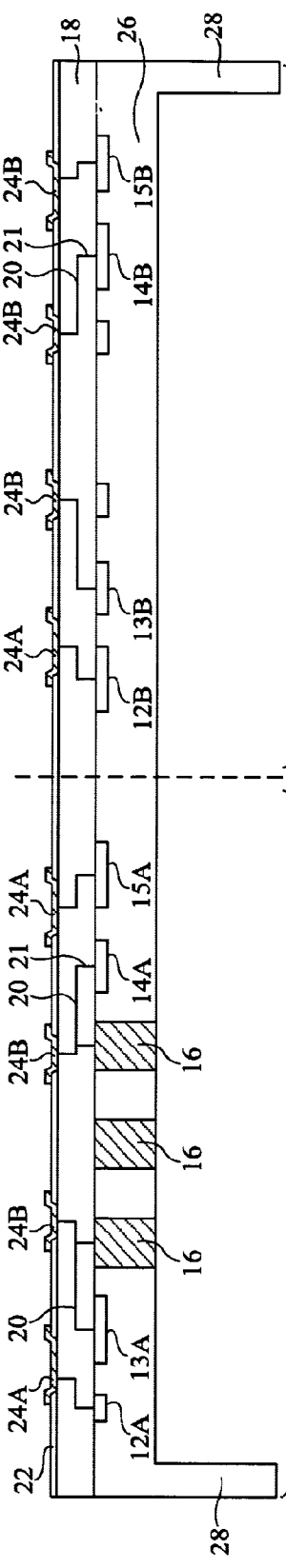

At the step illustrated in FIG. 2, semiconductor wafer 10 has been thinned down to form a semiconductor layer 26 exposing, on the side of alternative A, the conductive material of the lower portions of conductive trenches 16. The thinning down of wafer 10 is preferably performed on a central portion only of wafer 10, the contour of wafer 28 keeping a greater thickness. The thinning down of wafer 10 is performed by grinding and/or by mechanical or chem.-mech. polishing (CMP) and/or by wet etch (chemical process). Thus, the obtained structure remains rigid due to peripheral ring 28. It should be noted that different portions 28 forming various stiffening beams under the surface of layer 26 may be provided, for example, on the contour of each individual chip or of an assembly of individual chips. Such stiffening beam structures are especially described in patent application FR 2771108 and will not be described any further herein. The thinning down of wafer 10 may be performed by anisotropic etching.

Figure 3:
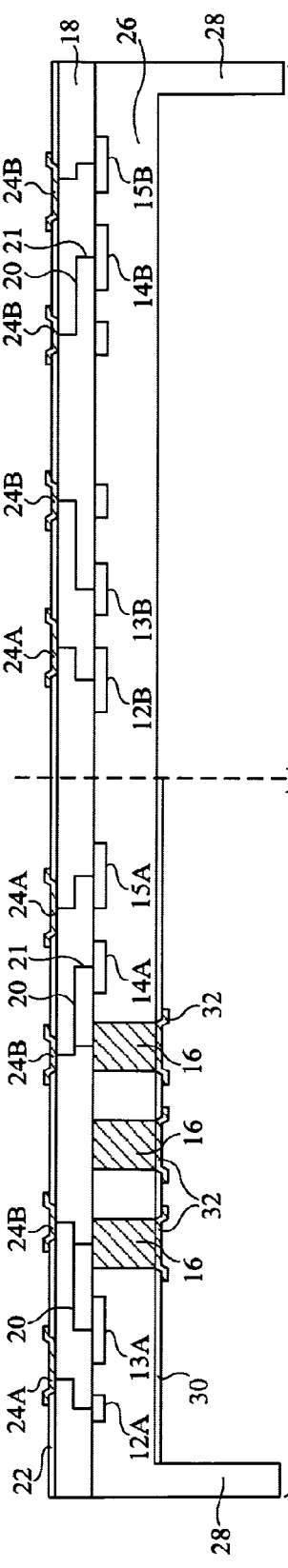

At the step illustrated in FIG. 3, a layer of an insulating material 30 has been formed in alternative A, on the lower surface of semiconductor layer 26. It should be noted that layer 30 of insulating material may, if both alternatives A and B are provided on the same wafer 10, extend over the lower surface of layer 26 in alternative B. As an example, insulating layer 30 may be made of silicon oxide, silicon nitride, or a stack of these materials. Insulating layer 30 comprises openings in front of conductive trenches 16, where conductive bonding regions 32 are formed. In the same way as bonding regions 24A and 24B, bonding regions 32 may be formed of a stack of conductive materials providing both a good adherence to the conductive material of trenches 16 and a good hold of the solder bumps subsequently formed on their surfaces.

Figure 4:
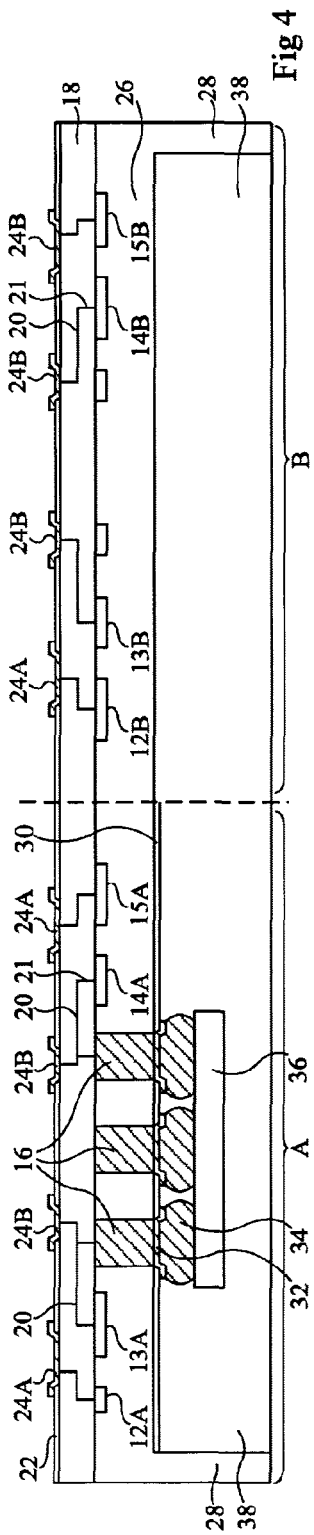

At the step illustrated in FIG. 4, electronic chips have been installed on the lower surface of semiconductor layer 26. For this purpose, solder bumps 34 are formed on bonding regions 32 and electronic chips 36 are attached by soldering on solder bumps 34. Installed chips 36 may comprise many electronic components.

Solder bumps 34 may have a diameter ranging between 20 and 100 μm and installed chips 36 may have a thickness ranging between 75 and 125 μm. Chips 36 may also be installed, rather than via solder bumps, by wire bonding, or by any other known connection means.

Then, a thick resin layer 38 has been deposited on the lower surface of the structure to fill the volume of trench 10 removed at the step of FIG. 2. Preferably, layer 38 is formed by compression molding, which provides a layer 38 having a very planar lower surface.

For resin 38 to be sufficiently rigid and resistant, a loaded epoxy resin may be selected. Further, for the resin to properly penetrate into the space located between installed chips 36 and layer 30, the resin loads preferably have a diameter smaller than 20 μm. To provide a good rigidity and a good dissipation of the heat generated by the electronic components, resin 30 may have a Young's modulus ranging between 3 and 10 GPa and a thermal expansion coefficient close to that of silicon.

Figure 5:
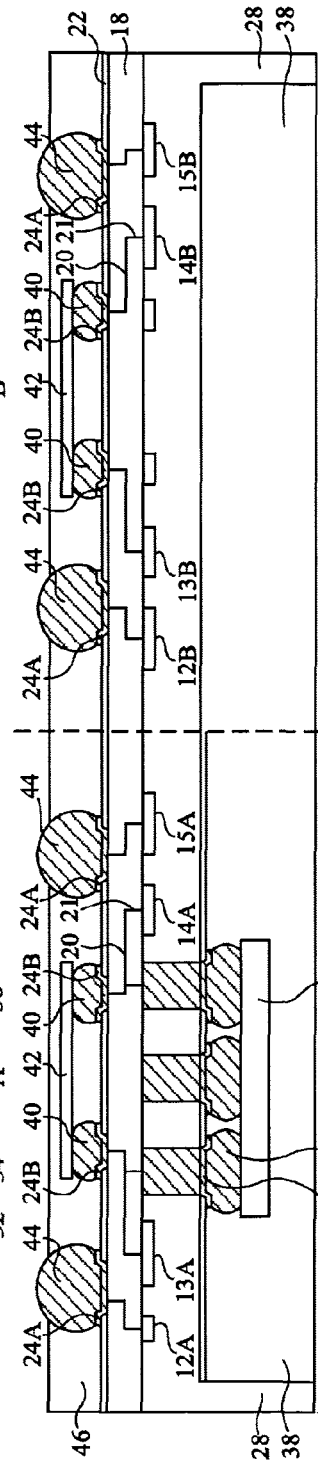

At the step illustrated in FIG. 5, electronic chips 42 have been installed on bonding regions 24B. For this purpose, solder bumps 40 are formed on bonding regions 24B and chips 42 are attached by soldering on solder bumps 40. As an example, solder bumps 40 may have a diameter ranging between 20 and 100 µm and installed chips 42 may have a thickness ranging between 75 and 125 µm. The forming of a structure such as that in FIG. 5 provides a greater component density per individual chip than at the forming of electronic components only on semiconductor wafer 10.

Solder bumps 44 of greater diameter, for example, ranging between 150 and 300 µm, are formed on bonding regions 24A. A resin layer 46 is then formed on the upper surface of the device, resin layer 46 letting an upper portion of solder bumps 44 uncovered, while totally covering the stack of bumps 40 and of chips 42. For this purpose, layer 46 may have a thickness ranging between 75 and 125 µm. Resin layer 46 enables to protect the upper surface of the structure.

Figure 6:
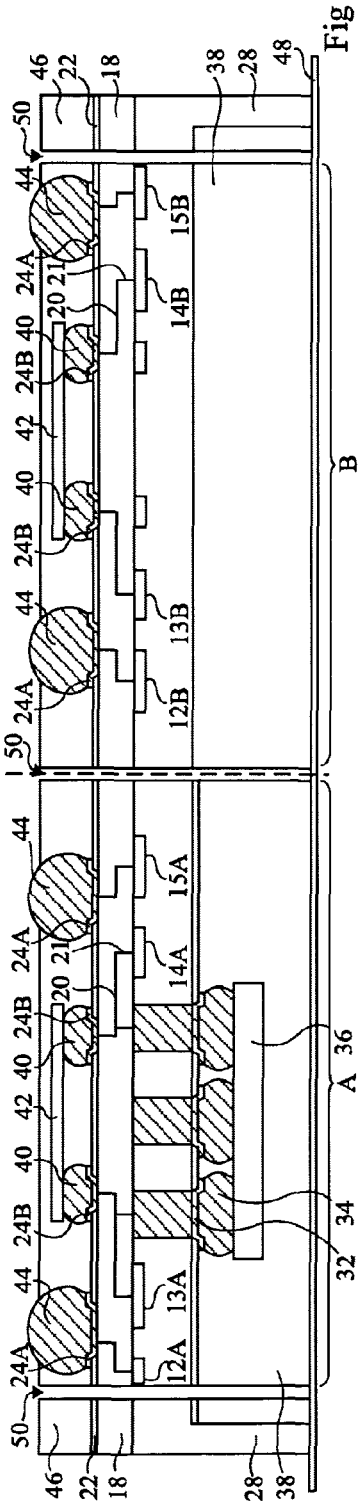

At the step illustrated in FIG. 6, the structure of FIG. 5 has been secured on an adhesive strip or paper 48, on its lower surface side. Then, the individual electronic chips are separated from one another, for example, by sawing. The sawing defines intervals 50 across the entire thickness of the device between individual chips. Conventionally, the step of FIG. 6 may be followed by a step of filling of openings 50 with a resin, then by a new scribing into individual chips, which enables to protect the sides of the scribed individual chips and to complete the encapsulation. The individual chips are ready to be taken one by one to be assembled on a printed circuit board or the like.

The method disclosed herein is particularly well adapted to the forming of surface-mount encapsulated electronic chips, intended to be attached to the side of the surface of the semiconductor wafer on which the electronic components are formed. It is further specifically adapted for encapsulated chips in which electronic circuit chips are installed on the front surface of the semiconductor wafer, but also on the rear surface thereof. Further, the forming of stiffening beams 28 under semiconductor layer 26 enables avoiding any warpage of this semiconductor layer.

It should be noted that this method is likely to have many variations. In particular, the various materials described in the different steps of this method are not limited to the examples provided herein.

Of course, the present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for encapsulating electronic components, comprising acts of:
   forming first electronic components on a first surface of a semiconductor wafer;
   thinning a majority of a volume of the semiconductor wafer except at the periphery of the wafer; and
   filling the thinned portions of the semiconductor wafer with a reinforced resin.

2. The method of claim 1, further comprising forming second electronic components on a second surface of the wafer at a thinned portion of the wafer, wherein at least one of the second electronic components is electrically coupled to at least one of the first electronic components through the thinned portion of the wafer.

3. The method of claim 2, further comprising installing a first chip connected to at least one of the second electronic components.

4. The method of claim 3, wherein the resin encapsulates the first chip.

5. The method of claim 1, further comprising:
   installing a first chip connected to at least one of the first electronic components;
   forming a solder bump connected to at least one of the first electronic components; and
   depositing a resin that encapsulates the first chip and partially covers the solder bump.

6. The method of claim 1, further comprising:
   bonding an adhesive strip on the reinforced resin; and
   cutting the wafer into individual chips.

7. The method of claim 1, wherein the forming first electronic components includes forming trenches in the first surface and filling the trenches with conductive material.

8. The method of claim 7, wherein the thinning exposes a surface of the conductive material.

9. The method of claim 1, wherein the thinning further comprises forming stiffening beams opposite the first surface.

10. The method of claim 8, wherein the reinforced resin contains loads having diameters smaller than 20 microns.

11. The method of claim 9, wherein the stiffening beams are on a contour of an individual chip or an assembly of individual chips.

12. The method of claim 9, further comprising:
    installing a second chip connected to at least one of the first electronic components;
    forming a solder bump connected to at least one of the first electronic components; and
    depositing a resin that encapsulates the second chip and partially covers the solder bump.

13. The method of claim 9, wherein the second chip has a thickness between 75 microns and 125 microns.

14. The method of claim 9, wherein the reinforced resin has a Young's modulus between 3 GPa and 10 GPa.

15. The method of claim 9, wherein the reinforced resin has a thermal expansion coefficient approximately equal to a thermal expansion coefficient of silicon.

16. The method of claim 9, further comprising forming second electronic components on a second surface of the wafer at a thinned portion of the wafer, wherein at least one of the second electronic components is electrically coupled to at least one of the first electronic components through the thinned portion of the wafer.

17. The method of claim 1, wherein a thickness of the semiconductor wafer that is not thinned is between 500 microns and 900 microns.

18. The method of claim 1, wherein the reinforced resin has a Young's modulus between 3 GPa and 10 GPa.

19. The method of claim 1, further comprising forming a layer of insulating material on a second surface of the semiconductor wafer at a thinned portion of the semiconductor wafer.

20. The method of claim 8, wherein the semiconductor wafer that is not thinned is between 500 microns and 900 microns and the trenches filled with conductive material are between 100 microns and 200 microns deep.

21. The method of claim 20, further comprising connecting a first chip to at least one exposed surface of the conductive material at a second surface of the semiconductor wafer, wherein a thickness of the first chip is between 75 microns and 125 microns.

22. The method of claim 21, further comprising:
    installing a second chip connected to at least one of the first electronic components;
    forming a solder bump connected to at least one of the first electronic components; and depositing a resin that encapsulates the second chip and partially covers the solder bump.

* * * * *